United States Patent [19]

Arvanitis

[11] 4,281,300
[45] Jul. 28, 1981

[54] MULTI-POLE CRYSTAL FILTER AND METHOD OF IMPROVING THE FREQUENCY RESPONSE

[75] Inventor: Aristotelis S. Arvanitis, Addison, Ill.

[73] Assignee: Motorola, Inc., Schaumburg, Ill.

[21] Appl. No.: 92,788

[22] Filed: Nov. 8, 1979

[51] Int. Cl.³ .................. H03H 9/56; H03H 9/58; H03H 9/60
[52] U.S. Cl. ................... 333/192; 333/189; 333/191
[58] Field of Search ................ 333/186–192; 310/317–321, 365–366

[56] References Cited

U.S. PATENT DOCUMENTS

| | | | |
|---|---|---|---|
| 2,248,776 | 7/1941 | Och | 333/188 |
| 3,609,601 | 9/1971 | Phillips et al. | 333/192 |
| 3,704,433 | 11/1972 | Garrison et al. | 310/321 X |
| 4,099,149 | 7/1978 | Yee | 333/192 |

*Primary Examiner*—Marvin L. Nussbaum
*Attorney, Agent, or Firm*—Mark Kahler; Edward M. Roney; James Gillman

[57] ABSTRACT

A crystal filter including at least one acoustically coupled crystal with at least three resonators thereon with an impedance block connected between the input and output of each crystal and the input and output phases of each crystal being adjusted so that attenuation zeros symmetric about a center frequency are produced to improve the frequency response of the filter without increasing the number of poles.

13 Claims, 10 Drawing Figures

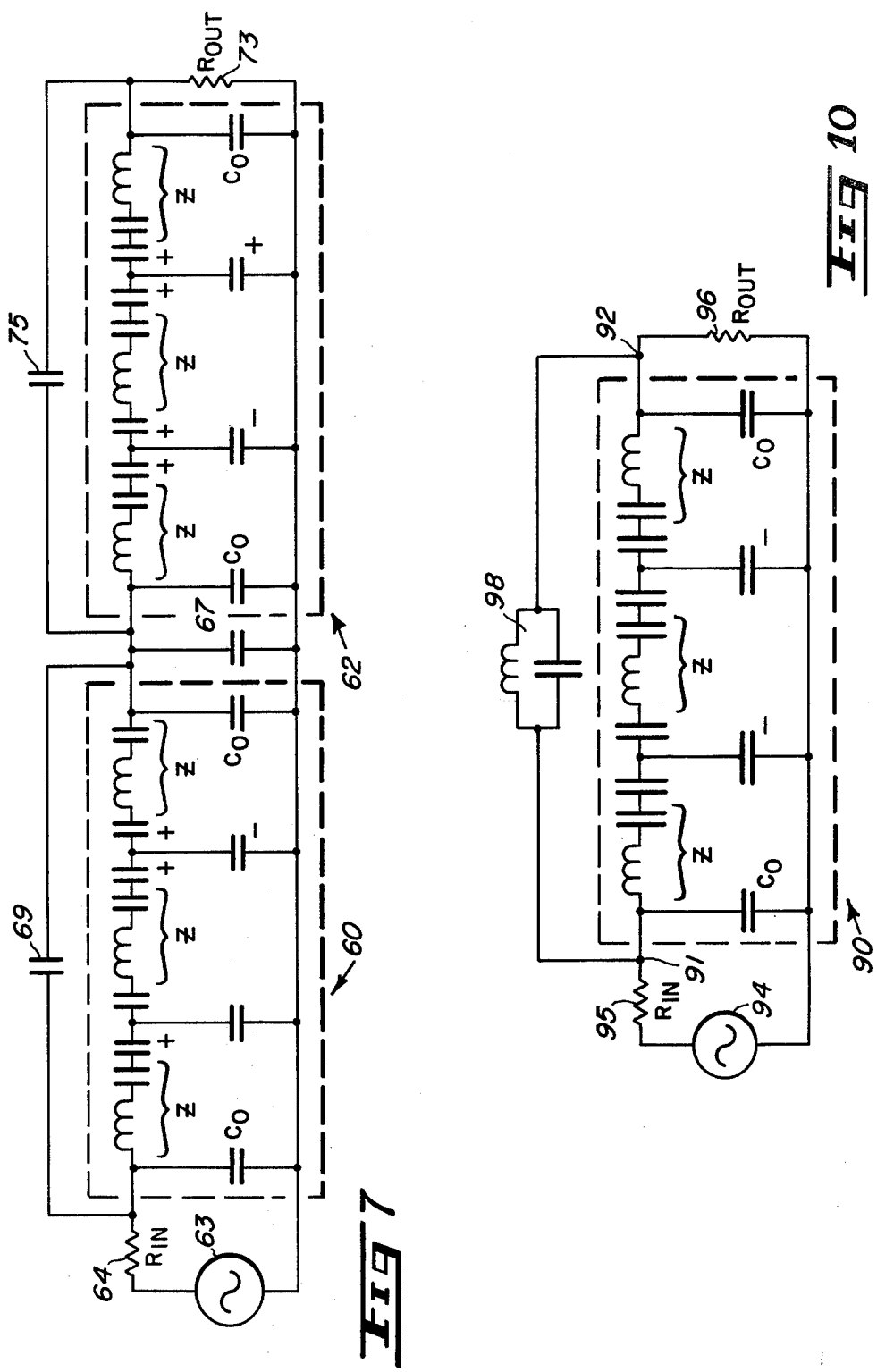

MULTI-POLE CRYSTAL FILTER AND METHOD OF IMPROVING THE FREQUENCY RESPONSE

BACKGROUND OF THE INVENTION

The present invention pertains to crystal filters for use in communications radios and the like, which filters have a number of poles depending upon the requirement of the radio. In the prior art, crystals having two resonators thereon are combined to form filters having a desired number of poles. In the design of a radio, for example, the sensitivity and selectivity are specified and the designer incorporates filters having the number of poles required to provide the specified selectivity and sensitivity. If, for example, a four pole filter will not provide the specified selectivity, the designer must go to a six pole filter, since he is restricted to combinations of two resonator crystals. However, increasing the filter by two poles, in many instances, (for example, when only minor increases in selectivity are required) may be relatively costly.

Typical examples of crystal filters utilizing two resonator crystals are disclosed in U.S. Pat. No. 3,633,134, issued Jan. 4, 1972 and entitled "Crystal Bandpass Filter Circuit"; U.S. Pat. No. 3,716,808, issued May 20, 1971, and entitled "Bandpass Filter Including Monolithic Crystal Elements With Resonating Portions Selected for Symmetrical Response"; and U.S. Pat. No. 3,947,784, issued Mar. 30, 1976, and entitled "Dual Coupled Monolithic Crystal Element For Modifying Response of Filter".

DESCRIPTION OF THE PREFERRED EMBODIMENT

The present invention pertains to crystal filters and methods of improving the frequency response thereof including at least one acoustically coupled crystal with at least three resonators thereon with an impedance block connected between the input and the output and the input-output phase relationship being adjusted so that attenuation zeros are formed which are symmetric with respect to a center frequency and the performance is improved sufficiently so that it is almost as good as the addition of the next highest set of poles.

It is an object of the present invention to provide crystal filters with improved frequency response for a given number of poles.

It is a further object of the present invention to provide a method of improving the frequency response of a crystal filter having a given number of poles.

These and other objects of this invention will become apparent to those skilled in the art upon consideration of the accompanying specification, claims and drawings.

BRIEF DESCRIPTION OF THE DRAWINGS

Referring to the drawings, wherein like characters indicate like parts throughout the Figures:

FIG. 7 is an electrical schematic representation of the crystal filter illustrated in FIG. 6;

FIG. 10 is an electrical schematic representation of another embodiment of a crystal filter embodying the present invention.

DESCRIPTION OF THE PREFERRED EMBODIMENTS

Figure 1:
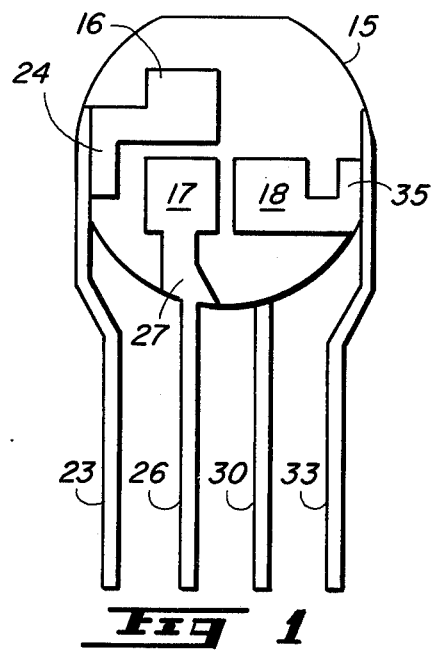
FIG. 1 is a plan view of an acoustically coupled crystal having three resonators thereon.
Figure 2:
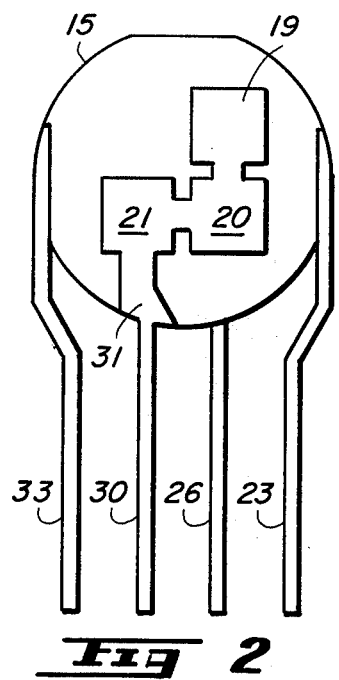
FIG. 2 is a plan view of the opposite side of the crystal illustrated in FIG. 1.

Referring specifically to FIGS. 1 and 2, a blank 15 of crystal material, such as quartz or the like, has three spots 16, 17 and 18 deposited on the front side thereof (FIG. 1) and three spots 19, 20 and 21 deposited on the reverse side thereof (FIG. 2). In this embodiment the spots are generally in the form of a square of conductive material and are positioned so that spots 16 and 19 are coaxial and form a first resonator, spots 17 and 20 are coaxial and form a second resonator and spots 18 and 21 are coaxial and form a third resonator. A first, or input, lead 23 serves to mount the blank 15 and is electrically connected to the spot 16 by means of deposited material 24. A second lead 26 is connected to spot 17 of the second resonator, by means of deposited material 27 on the front face of the blank 15. A third lead 30 is adapted to be connected to ground and is connected to the spot 21 by means of deposited material 31. A fourth, or output, lead 33 serves to mount the blank 15 (in conjunction with the lead 23) and is connected to the spot 18 by means of deposited material 35. In addition, all of the spots 19, 20 and 21 are electrically connected together by means of additional material deposited therebetween. Thus, all of the spots 17, 19, 20 and 21 are adapted to be grounded and both of the spots 16 and 18 are adapted to be positive with respect thereto so that the phase of signals applied to the input (lead 23) will be the same as signals available at the output (lead 33). The crystal 15 with its leads 23, 26, 30 and 33 is mounted in a suitable crystal holder (not shown). The construction and operation of a three resonator crystal of this nature is illustrated and disclosed in U.S. Pat. No. 4,156,214, issued May 22, 1979, and entitled "Multipole Resonator."

Figure 3:
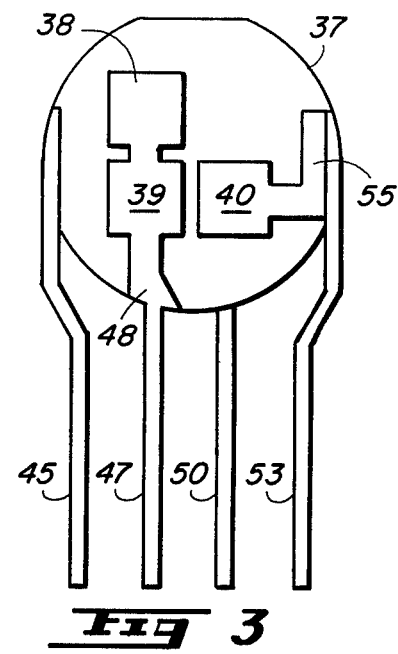
FIG. 3 is a plan view of a second embodiment of an acoustically coupled crystal having three resonators thereon.
Figure 4:
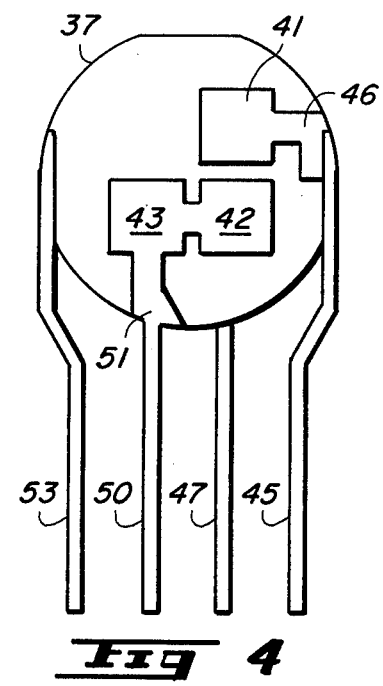
FIG. 4 is a plan view of the opposite side of the crystal illustrated in FIG. 3.

FIGS. 3 and 4 illustrate another embodiment of a three resonator crystal wherein a crystal blank 37 has three spots 38, 39 and 40 deposited on the front side thereof (FIG. 3) and three spots 41, 42 and 43 deposited on the opposite side thereof (FIG. 4). A first, or input, lead 45 serves to mount the blank 37 and is electrically connected to the spot 41 by means of additional deposited conducting material 46. A second lead 47 is adapted to be connected to ground and is electrically connected to the spot 39 by means of additional deposited conducting material 48. The spot 39 is also electrically connected to the spot 38 by material deposited therebetween. A third lead 50 is also adapted to be connected to ground and is connected to the spot 43 by additional deposited material 51. The spot 43 is also connected to the spot 42 by additional material deposited therebetween. A fourth, or output, lead 53 serves to mount the blank 37 (in conjunction with the lead 45) and is electrically connected to the spot 40 by means of additional deposited material 55. Thus, the spots 38–39 and 42–43 are adapted to be grounded so that the spots 40 and 41 are positive with respect thereto and the input resonator (spots 38 and 41) is at a different phase than the output resonator (spots 40 and 43).

Figure 5:
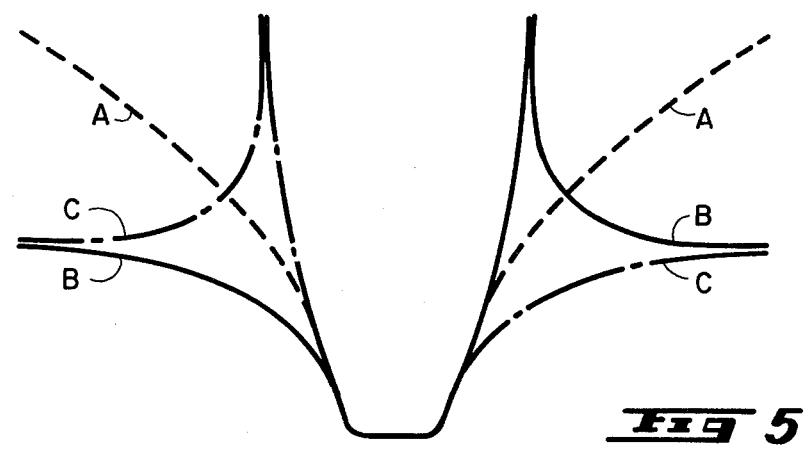
FIG. 5 is a graphical illustration of the frequency response of three different crystals.

Referring specifically to FIG. 5, three curves A, B and C are illustrated wherein the attenuation (ordinate axis) versus the frequency (abscissa axis) is plotted for three different crystals. Curve A illustrates the frequency response for either the crystal illustrated in FIGS. 1 and 2 or the crystal illustrated in FIGS. 3 and 4. Through much experimentation it has been found that inserting an impedance block between input and output on multi-pole filters can introduce attenuation zeros. These attenuation zeros dramatically alter the frequency response of the crystals and may be utilized to provide a substantial improvement therein. Connecting a capacitor between the input and output of the crystal illustrated in FIGS. 1 and 2 alters the frequency response (introduces an attenuation zero) so that it appears generally as depicted by the curve C in FIG. 5. Connecting a capacitor between the input and output of the crystal illustrated in FIGS. 3 and 4 alters the frequency response (introduces an attenuation zero) so that it appears generally as depicted by the curve B of FIG. 5. From these curves it can be seen that a capacitive impedance block connected between the input and output of a crystal having an odd number of resonators, or poles, (acoustically coupled) which resonators are connected so that the input and output are at the same phase, produce an area in the response curve wherein the attenuation goes to infinity below the center frequency of the crystal. In a similar fashion, if a capacitive impedance block is connected between the input and output of an acoustically coupled crystal having an odd number of resonators with the input and output resonators at different phases, the response curve is altered so that an area therein above the center frequency goes to infinity. Further, if both crystals are generally equal (except for the difference in the phase relationship) the curves will be generally mirror images of each other about the center frequency.

Figure 8:
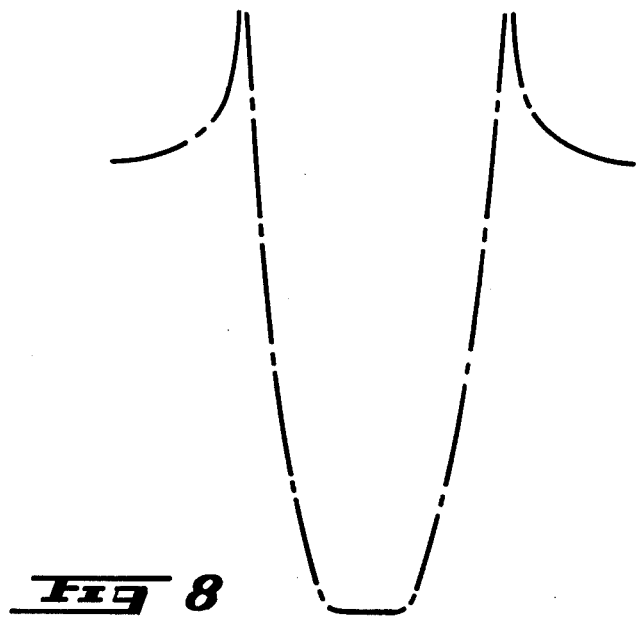
FIG. 8 is a graphical illustration of the frequency response of the filter illustrated in FIG. 6.
Figure 6:
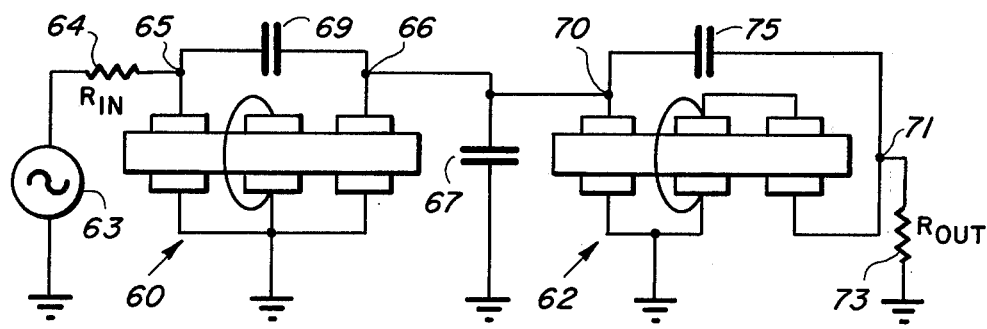
FIG. 6 is a schematic diagram of a crystal filter embodying the present invention.

Referring to FIG. 6, a first three resonator crystal 60 and a second three resonator crystal 62 are diagrammatically depicted. The crystal 60 is the type illustrated in FIGS. 1 and 2 and the crystal 62 is the type illustrated in FIGS. 3 and 4. A signal source, depicted in the usual manner by means of a signal generator 63 and input resistance 64 is connected between ground and an input terminal 65 of the crystal 60. An output terminal 66 of the crystal 60 is connected through an external capacitor 67 to ground. A capacitive impedance block, which in this embodiment is a capacitor 69, is connected between the input terminal 65 and the output terminal 66. There is an internal capacitance designated $C_o$ (See FIG. 7) of the crystal between each set of electrodes. Thus, the crystal 60 will provide a frequency response as illustrated by the curve C of FIG. 5. The output terminal 66 of the crystal 60 is also connected to an input terminal 70 of the crystal 62. An output terminal 71 of the crystal 62 is connected through a load (depicted as an output resistance 73) to ground. A capacitive impedance block, which in this embodiment is a capacitor 75, is connected between the input terminal 70 and the output terminal 71 so that the crystal 62 provides a frequency response as illustrated by curve B of FIG. 5. Connecting the two crystals 60 and 62 in series, or cascading them, combines the frequency responses of each of the individual crystals to provide a frequency response for the overall filter as illustrated in FIG. 8. Thus, a six pole filter is provided utilizing only two crystal blanks and having an improved frequency response over prior art six pole filters. FIG. 7 illustrates an electrically equivalent schematic of the structure illustrated in FIG. 6.

Figure 9:
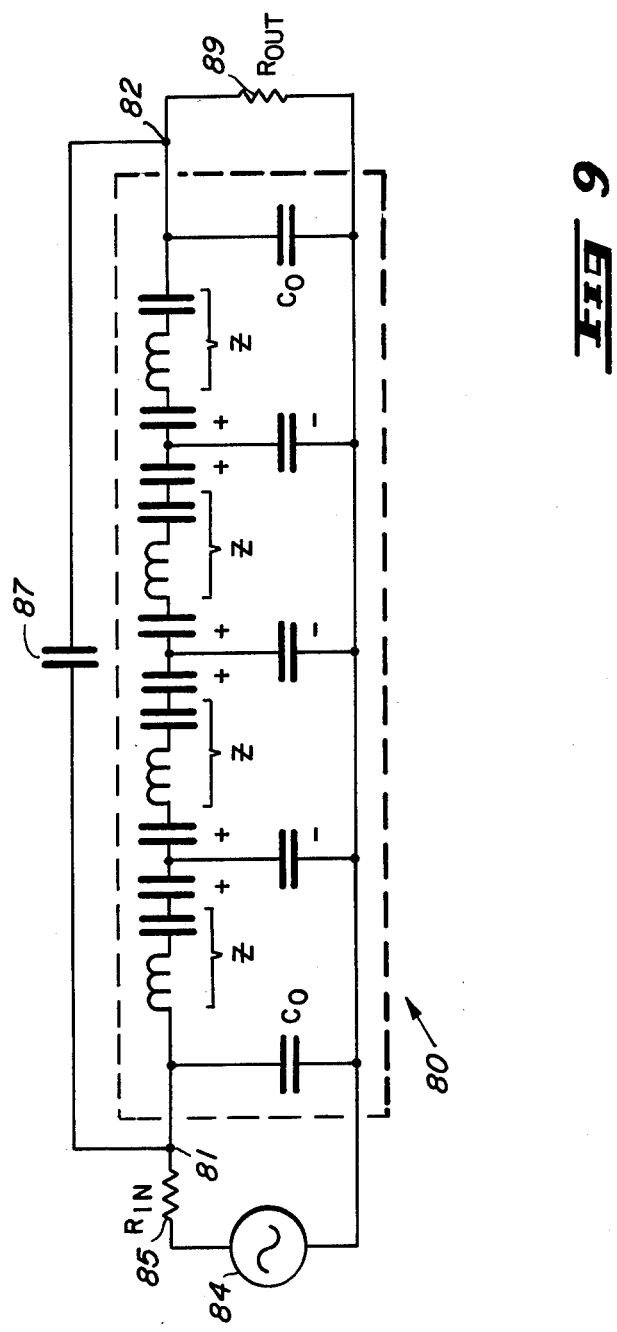
FIG. 9 is an electrical schematic representation of another embodiment of a crystal filter embodying the present invention.

Referring to FIG. 9, a four resonator or pole crystal, generally designated 80, is illustrated by means of an electrical equivalent schematic circuit. The crystal 80 is contained within a dotted line box and has an input terminal 81 and an output terminal 82. A signal source, consisting of a signal generator 84 and input resistance 85 is connected between the input terminal 81 and a reference, which may be a common or ground similar to that described in conjunction with FIG. 6. A capacitive impedance block, which in this embodiment is a capacitor 87 is connected between the input terminal 81 and the output terminal 82. A load, depicted by an output resistance 89, is connected between the output terminal 82 and the reference. The embodiment illustrated in FIG. 9 produces an output symmetrical about a center frequency, generally as illustrated in FIG. 8. From this embodiment it can be seen that if the number of resonators of the crystal is even and the impedance block connected between the input and output is capacitive, attenuation zeros are formed which are symmetric with respect to the center frequency of the crystal.

Referring to FIG. 10, an acoustically coupled three resonator crystal included within a dotted line box and generally designated 90 is illustrated. The crystal 90 has an input terminal 91 and an output terminal 92 associated therewith. A signal source, depicted by a signal generator 94 and an input resistance 95 is connected between the input terminal 91 and a reference. A load, depicted by an output resistor 96, is connected between the output terminal 92 and the reference. A parallel tuned circuit 98 is connected between the input terminal 91 and the output terminal 92. The parallel tuned circuit 98 is shown simply as an inductance and capacitor in parallel but it will be understood by those skilled in the art that many variations of this embodiment can be constructed. The frequency response of the circuitry illustrated in FIG. 10 is symmetrical about the center frequency of the crystal 90 and appears generally as illustrated by FIG. 8. Thus, it can be seen that if the number of resonators or poles of the crystal is odd and the impedance block is a tuned parallel circuit, the frequency response and attenuation zeros of the filter are symmetrical about the center frequency.

Thus, embodiments of several crystal filters including at least one acoustically coupled crystal with at least three resonators or poles thereon has been disclosed. By connecting an impedance block between the input and output of each of the crystals and adjusting the input-output phase relationship, if necessary, through the construction of the crystal, the frequency response of the filter is improved over prior art filters having a similar number of poles. Thus, the number of crystal blanks utilized in the crystals filter is substantially reduced, thereby reducing the cost and complexity, and the selectivity (frequency response) is improved.

While I have shown and described specific embodiments of this invention, further modifications and improvements will occur to those skilled in the art. I desire it to be understood, therefore, that this invention is not limited to the particular forms shown and I intend in the appended claims to cover all modifications which do not depart from the spirit and scope of this invention.

I claim:

1. A crystal filter comprising:
   (a) an acoustically coupled crystal with three resonators formed thereon;
   (b) connecting means associated with said crystal and defining an input and an output, said connecting means further connecting the three resonators so that the phase relationship of the input and the output are the same; and
   (c) a parallel tuned circuit connected from the input to the output and constructed to provide an attenuation zero symmetrically located about a desired center frequency.

2. A crystal filter comprising:
   (a) an acoustically coupled crystal with four resonators formed thereon;
   (b) connecting means associated with said crystal and defining an input and an output, said connecting means further connecting the four resonators so that the phase relationship of the input and the output are the same; and
   (c) a capacitor connected from the input to the output and constructed to provide an attenuation zero symmetrically located about a desired center frequency.

3. A crystal filter comprising:
   (a) first and second three-resonator acoustically coupled crystals each having an input and an output;
   (b) first and second capacitors, said first capacitor coupled between the input and the output of said first crystal, said second capacitor coupled between the input and the output of said second crystal;
   (c) said first and second crystal each having different input-output phase relationships and cooperating with said capacitors to provide substantially opposite responses about a desired center frequency, and
   (d) means connecting said first and second crystals in series so that the individual responses cooperate to provide an overall response which is symmetric about the desired center frequency.

4. A cystal filter as claimed in claim 3 wherein the first and second crystals each include a flat plate of crystal with a conductive spot on each side thereof for each of the three resonators and the different input-output phase relationships are produced by connecting all of the spots on one side of one crystal to a reference and connecting opposite spots of input and output poles on the other crystal to a reference.

5. In a crystal filter including at least one crystal with at least three acoustically coupled resonators, a method of improving the frequency response of a filter with a given number of poles comprising the steps of:
   (a) selecting a desired number of resonators for the filter;
   (b) selecting a number of multi-resonator crystals which will provide the desired number of resonators for the filter, each of said crystals having an even number of resonators thereon;
   (c) connecting a capacitor impedance block between the input and output of each of the selected crystals and adjusting the input-output phase relationship of each crystal to one of an in-phase and out-of-phase relationship by connecting different ones of the resonators on each crystal to provide each crystal with a frequency response characteristic wherein attenuation zeros are symmetric with respect to a center frequency, and
   (d) connecting the selected crystals in series to provide a symmetrical frequency response for the filter.

6. A method for improving the frequency response of a filter as claimed in claim 5 wherein the desired number of resonators of the filter is four and the selected number of multi-resonator crystals is one four-resonator crystal with a capacitor connected between the input and the output thereof to provide a symmetric attenuation zero with respect to the center frequency.

7. A method of improving the frequency response of a filter as claimed in claim 5 wherein each resonator of each crystal includes a conductive spot deposited on each side of a flat crystal, at least one spot of each resonator being connected to a reference and the step of adjusting the input-output phase relationship includes connecting spots on the same side of the crystal for input and output resonators to the reference to produce the in-phase relationship and connecting spots on the opposite sides of the crystal for input and output resonators to the reference to produce the out-of-phase relationship.

8. In a crystal filter including at least one crystal with at least three acoustically coupled resonators, a method of improving the frequency response of a filter with a given number of poles comprising the steps of:
   (a) selecting a desired number of resonators for the filter;
   (b) selecting a number of multi-resonator crystals which will provide the desired number of resonators for the filter, each of said crystals having an odd number of resonators thereon;
   (c) connecting a capacitor impedance block between the input and output of each of the selected crystals and adjusting the input-output phase relationship of each crystal to one of an in-phase and out-of-phase relationship by connecting different ones of the resonators on each crystal such that at least one of said crystals exhibits a frequency response characteristic wherein the input-output phase relationship is in-phase and wherein attenuation zeros are asymmetric with respect to a center frequency, an infinite impedance area appearing at frequencies lower than the center frequency, the remaining crystals exhibiting a frequency response characteristic wherein the input-output phase relationship is out-of-phase and wherein attenuation zeros are asymmetric with respect to a center frequency, an infinite impedance area appearing at frequencies greater than the center frequency, and
   (d) connecting the selected crystals in series to provide a symmetrical frequency response for the filter.

9. A method for improving the frequency response of a filter as claimed in claim 8 wherein the desired number of resonators of the filter is six and the selected number of multi-resonator crystals is two three-resonator crystals, both of which are connected with capacitor impedance blocks and one of which has an in-phase and one of which has an out-of-phase relationship.

10. A method for improving the frequency response of a filter as claimed in claim 8 wherein each resonator of each crystal includes a conductive spot deposited on each side of a flat crystal, at least one spot of each resonator being connected to a reference and the step of adjusting the input-output phase relationship includes connecting spots on the same side of the crystal for input and output resonators to the reference to produce the in-phase relationship and connecting spots on the opposite sides of the crystal for input and output resonators to the reference to produce the out-of-phase relationship.

11. In a crystal filter including at least one crystal with at least three acoustically coupled resonators, a method of improving the frequency response of a filter with a given number of poles comprising the steps of:
 (a) selecting a desired number of resonators for the filter;
 (b) selecting a number of multi-resonator crystals which will provide the desired number of resonators for the filter, each of said crystals having an odd number of resonators thereon;
 (c) connecting a parallel tuned circuit impedance block between the input and output of each of the selected crystals and adjusting the input-output phase relationship of each crystal to one of an in-phase and out-of-phase relationship by connecting different ones of the resonators on each crystal to provide each crystal with a frequency response characteristic wherein an attenuation zero is produced symmetrically about a center frequency to provide a symmetrical frequency response, and
 (d) connecting the selected crystals in series to provide a symmetrical frequency response for the filter.

12. A method of improving the frequency response of a filter as claimed in claim 11 wherein the desired number of resonators of the filter is three and the selected number of multi-resonator crystals is one three-resonator crystal with a parallel tuned circuit connected between the input and the output to provide a symmetric attenuation zero with respect to the center frequency.

13. A method of improving the frequency response of a filter as claimed in claim 11 wherein each resonator of each crystal includes a conductive spot deposited on each side of a flat crystal, at least one spot of each resonator being connected to a reference and the step of adjusting the input-output phase relationship includes connecting spots on the same side of the crystal for input and output resonators to the reference to produce the in-phase relationship and connecting spots on the opposite sides of the crystal for input and output resonators to the reference to produce the out-of-phase relationship.

* * * * *

UNITED STATES PATENT AND TRADEMARK OFFICE
CERTIFICATE OF CORRECTION

PATENT NO. : 4281300

DATED : July 28, 1981

INVENTOR(S) : Aristotelis S. Arvanitis

It is certified that error appears in the above—identified patent and that said Letters Patent is hereby corrected as shown below:

Column 5, Line 50, delete the word "poles" and insert the word --resonators--.

*Signed and Sealed this*

*Twenty-fourth* Day of August 1982

[SEAL]

Attest:

GERALD J. MOSSINGHOFF

*Attesting Officer* — *Commissioner of Patents and Trademarks*